(12) United States Patent
Kim et al.

(10) Patent No.: US 12,412,754 B2
(45) Date of Patent: Sep. 9, 2025

(54) LIQUID SUPPLY APPARATUS AND SUBSTRATE TREATMENT APPARATUS INCLUDING THE SAME

(71) Applicant: SEMES CO., LTD., Chungcheongnam-do (KR)

(72) Inventors: Kang Sul Kim, Chungcheongnam-do (KR); Tae Keun Kim, Chungcheongnam-do (KR); Kyeong Min Lee, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 197 days.

(21) Appl. No.: 18/242,003

(22) Filed: Sep. 5, 2023

(65) Prior Publication Data

US 2024/0178010 A1    May 30, 2024

(30) Foreign Application Priority Data

Nov. 24, 2022    (KR) .......................... 10-2022-0159175

(51) Int. Cl.
*H01L 21/67*    (2006.01)
(52) U.S. Cl.
CPC ............................. *H01L 21/67051* (2013.01)
(58) Field of Classification Search
CPC ................................................ H01L 21/67051
See application file for complete search history.

(56) References Cited

FOREIGN PATENT DOCUMENTS

| JP | 2001-221163 | 8/2001 |
|---|---|---|
| JP | 2008-118026 | 5/2008 |
| JP | 4983885 | 7/2012 |
| KR | 10-2015-0080195 | 7/2015 |
| KR | 10-2016-0019013 | 2/2016 |
| KR | 10-2321443 | 11/2021 |

OTHER PUBLICATIONS

Notice of Allowance dated Jan. 7, 2025 for Korean Patent Application No. 10-2022-0159175 and its English translation from Global Dossier.

*Primary Examiner* — Jason Y Ko
(74) *Attorney, Agent, or Firm* — WOMBLE BOND DICKINSON (US) LLP

(57) ABSTRACT

A liquid supply apparatus is provided. The liquid supply apparatus includes: a base unit having an operating space, an inlet port, through which a treatment liquid is introduced, and an outlet port, through which the treatment liquid is discharged, formed therein; bellows having the operating space formed on its outside within the base unit, including an inlet and an outlet, which form ends of the inlet and outlet ports, respectively, of the base unit and communicate to create a storage space that the treatment liquid flows in and out of, and expanding or contracting to increase or reduce the volume of the storage space; an operating unit supplying operating fluid into or discharging the operating fluid from the operating space; and a drain line communicating with the storage space, from below the base unit, and discharging the treatment liquid, wherein the operating unit supplies the operating fluid into the operating space to enable the bellows to contract, or discharges the operating fluid from the operating space to enable the bellows to expand, and the drain line discharges residual treatment liquid remaining in the storage space to replace the treatment liquid.

19 Claims, 12 Drawing Sheets

LIQUID SUPPLY APPARATUS AND SUBSTRATE TREATMENT APPARATUS INCLUDING THE SAME

CROSS-REFERENCE TO RELATED APPLICATION

This application claims priority from Korean Patent Application No. 10-2022-0159175 filed on Nov. 24, 2022 in the Korean Intellectual Property Office, and all the benefits accruing therefrom under 35 U.S.C. 119, the contents of which in its entirety are herein incorporated by reference.

BACKGROUND

1. Field

The present disclosure relates to a liquid supply apparatus and a substrate treatment apparatus including the same.

2. Description of the Related Art

A photo process for manufacturing semiconductor devices may involve forming a photoresist layer on a wafer, followed by exposure and development. During this photo process, a coating apparatus may be used to form the photoresist layer on the wafer or to apply a developing solution for shaping the photoresist layer.

The coating apparatus may include a pump for supplying treatment liquids, such as photoresist and developing solutions. In other words, the coating apparatus can apply various treatment liquids onto the wafer through fluid pumping.

Meanwhile, the pump is driven by a motor, and when the motor starts, there is a temporary increase in load. To avoid frequent stopping and restarting of the motor within a short period of time, the motor continues to operate. Thus, to intermittently supply treatment liquid at each substrate treatment position while keeping the pump running, a treatment liquid circulation structure is necessary. The treatment liquid circulation structure prevents the continuous ejection of treatment liquid onto the substrate and instead allows for the recovery of the treatment liquid from the nozzles back to the storage tank. As a result, lines need to be connected to the pump, and additional components are required along those lines. However, this may introduce complexity to the overall treatment liquid circulation structure. Furthermore, during the replacement of the existing treatment liquid with a new treatment liquid, there is a potential risk of mixing the new and existing treatment liquids if there is residual treatment liquid inside the pump. This is particularly problematic when the new and existing treatment liquids differ in type or viscosity. Therefore, improvements are needed to address such and other issues.

SUMMARY

Aspects of the present disclosure provide a liquid supply apparatus capable of supplying treatment liquid without using a motor and releasing any residual treatment liquid when replacing it with a new treatment liquid, and a substrate treatment apparatus including the liquid supply apparatus.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a liquid supply apparatus includes: a base unit having an operating space, an inlet port, through which a treatment liquid is introduced, and an outlet port, through which the treatment liquid is discharged, formed therein; bellows having the operating space formed on its outside within the base unit, including an inlet and an outlet, which form ends of the inlet and outlet ports, respectively, of the base unit and communicate to create a storage space that the treatment liquid flows in and out of, and expanding or contracting to increase or reduce the volume of the storage space; an operating unit supplying operating fluid into or discharging the operating fluid from the operating space; and a drain line communicating with the storage space, from below the base unit, and discharging the treatment liquid, wherein the operating unit supplies the operating fluid into the operating space to enable the bellows to contract, or discharges the operating fluid from the operating space to enable the bellows to expand, and the drain line discharges residual treatment liquid remaining in the storage space to replace the treatment liquid.

According to another aspect of the present disclosure, a substrate treatment apparatus includes: a substrate support unit supporting a substrate; a cup portion surrounding the substrate support unit; a nozzle unit connected to a treatment liquid supply line and ejecting a treatment liquid onto the substrate; and a liquid supply apparatus provided in the treatment liquid supply line and suppling the treatment liquid to the nozzle unit, wherein the liquid supply apparatus includes a base unit having an operating space, an inlet port, through which the treatment liquid is introduced, and an outlet port, through which the treatment liquid is discharged, formed therein, bellows having the operating space formed on its outside within the base unit, including an inlet and an outlet, which form ends of the inlet and outlet ports, respectively, of the base unit and communicate to create a storage space that the treatment liquid flows in and out of, and expanding or contracting to increase or reduce the volume of the storage space, an operating unit supplying operating fluid into or discharging the operating fluid from the operating space, and a drain line communicating with the storage space, from below the base unit, and discharging the treatment liquid, the operating unit supplies the operating fluid into the operating space to enable the bellows to contract, or discharges the operating fluid from the operating space to enable the bellows to expand, and the drain line discharges residual treatment liquid remaining in the storage space to replace the treatment liquid.

According to another aspect of the present disclosure, a liquid supply apparatus has a treatment liquid supply line connected thereto and supplies the treatment liquid to a nozzle unit, which ejects the treatment liquid onto a substrate. The liquid supply apparatus includes: a base unit having an operating space, an inlet port, which is formed through an upper part of the base unit and through which treatment liquid is introduced, and an outlet port, which is formed through the upper part of the base unit adjacent to the inlet port and through which the treatment liquid is discharged, formed therein; bellows having the operating space formed on its outside within the base unit, including having an inlet and an outlet, which form ends of the inlet and outlet ports, respectively, of the base unit and communicate to create a storage space that the treatment liquid flows in and out of, and expanding or contracting to increase or reduce the volume of the storage space; an operating unit supplying operating fluid, which includes an inert gas or air, into or discharging the operating fluid from the operating space; and a drain line communicating with the storage space, from below the base unit, and discharging the treatment liquid, wherein the operating unit supplies the operating fluid into the operating space to enable the bellows to contract, or discharges the operating fluid from the operating space to enable the bellows to expand, and the drain line discharges residual treatment liquid remaining in the storage space in a state where the contraction and expansion of the bellows have stopped with the bellows in its minimally contracted state.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Preferred embodiments of the present disclosure will hereinafter be described in detail with reference to the accompanying drawings. The advantages and features of the invention of the present disclosure, and methods for achieving them will become apparent from the detailed embodiments provided in conjunction with the accompanying drawings. However, it should be understood that the invention is not limited to the embodiments disclosed herein, but can be implemented in various other forms. The disclosed embodiments are provided to fully disclose the invention to those skilled in the art with ordinary knowledge in the field and are intended to define the scope of the invention solely by the claims. Throughout the specification, the same reference numerals refer to the same components.

The terminology used in this specification is for the purpose of describing the embodiments and should not be construed as limiting the invention. In this specification, the singular forms include the plural forms unless otherwise specified in the wording. The terms "comprises" and "comprising" used in the specification do not exclude the presence or addition of one or more other components, steps, operations, and/or elements as mentioned.

Figure 1:
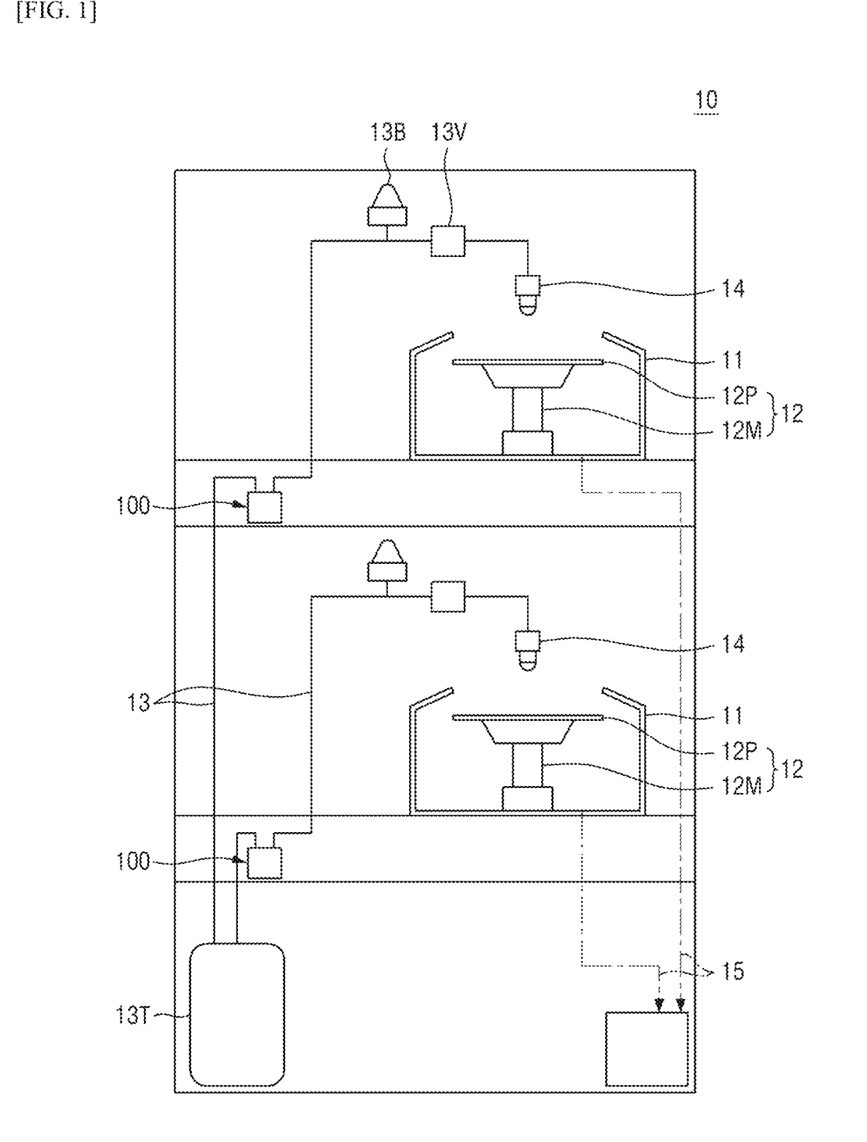
FIG. 1 is a schematic diagram of a substrate treatment apparatus according to some embodiments of the present disclosure.

FIG. 1 is a schematic diagram of a substrate treatment apparatus according to some embodiments of the present disclosure.

Referring to FIG. 1, a substrate treatment apparatus 10 may include cup portions 11, substrate support units 12, and nozzle units 14. A treatment liquid may be supplied onto a substrate continuously or intermittently. For example, the treatment liquid may be a developing solution or a cleaning solution, but the present disclosure is not limited thereto.

The cup portions 11, which recover the treatment liquid, may be provided to surround the substrate support units 12. The cup portions 11 may be provided in the form of cylinders with open tops. Exhaust lines 15 for discharging the treatment liquid to the outside may be formed in the cup portions 11.

The substrate support units 12 may support and rotate substrates within the cup portions 11. Each of the substrate support units 12 may include a support plate 12P and a driving member 12M. The top surface of the support plate 12P may have pins (not illustrated) for supporting a substrate. The support plate 12P is rotatable by the driving member 12M. The driving member 12M may include a drive shaft and a driver. The drive shaft may be coupled to the bottom surface of the support plate 12P. The driver may provide a rotational force to the drive shaft and may be a motor.

The nozzle units 14 may eject the treatment liquid onto the substrates within the cup portions 11. Each of the nozzle units 14 may include one or more nozzles. If multiple nozzles are provided in each of the nozzle units 14, treatment liquid supply lines 13 connected to a storage tank 13T may be individually connected, allowing the multiple nozzles to independently eject the treatment liquid.

Although not specifically illustrated, the nozzle units 14 may be positioned at a waiting position in a recessed port and may be designed to be movable between a processing position and the waiting position. The processing position refers to the position where the nozzle units 14 are facing the substrates on the support plates 12P. The waiting position refers to the position where the nozzle units 14 remain in standby within the recessed port.

A filter (not illustrated), a flow meter (not illustrated), a heater (not illustrated), a bubble cutter 13B, an air vent 13V, and a liquid supply apparatus 100 may be provided in each of the treatment liquid supply lines 13, but the present disclosure is not limited thereto.

The bubble cutter 13B may be provided downstream of the liquid supply apparatus 100 in the corresponding treatment liquid supply line 13. For example, the bubble cutter 13B can remove bubbles generated during the flow of the treatment liquid.

The air vent 13V may be provided downstream of the liquid supply apparatus 100 in the corresponding treatment liquid supply line 13 to discharge and remove dissolved gases (e.g., air, $N_2$, or $O_2$) from the treatment liquid supply line 13. For example, the air vent 13V may be provided upstream of the bubble cutter 13B. The air vent 13V may remove larger bubbles, while the bubble cutter 13B may remove finer bubbles. However, the present disclosure is not limited to this example, and various modifications and examples are possible.

In another example, the air vent 13V may not be positioned in the corresponding treatment liquid supply line 13, but may be provided as a vent port above a base unit 110, near an inlet port 113 and an outlet port 115 of the liquid supply apparatus 100.

The liquid supply apparatus 100 will hereinafter be described.

Figure 2:
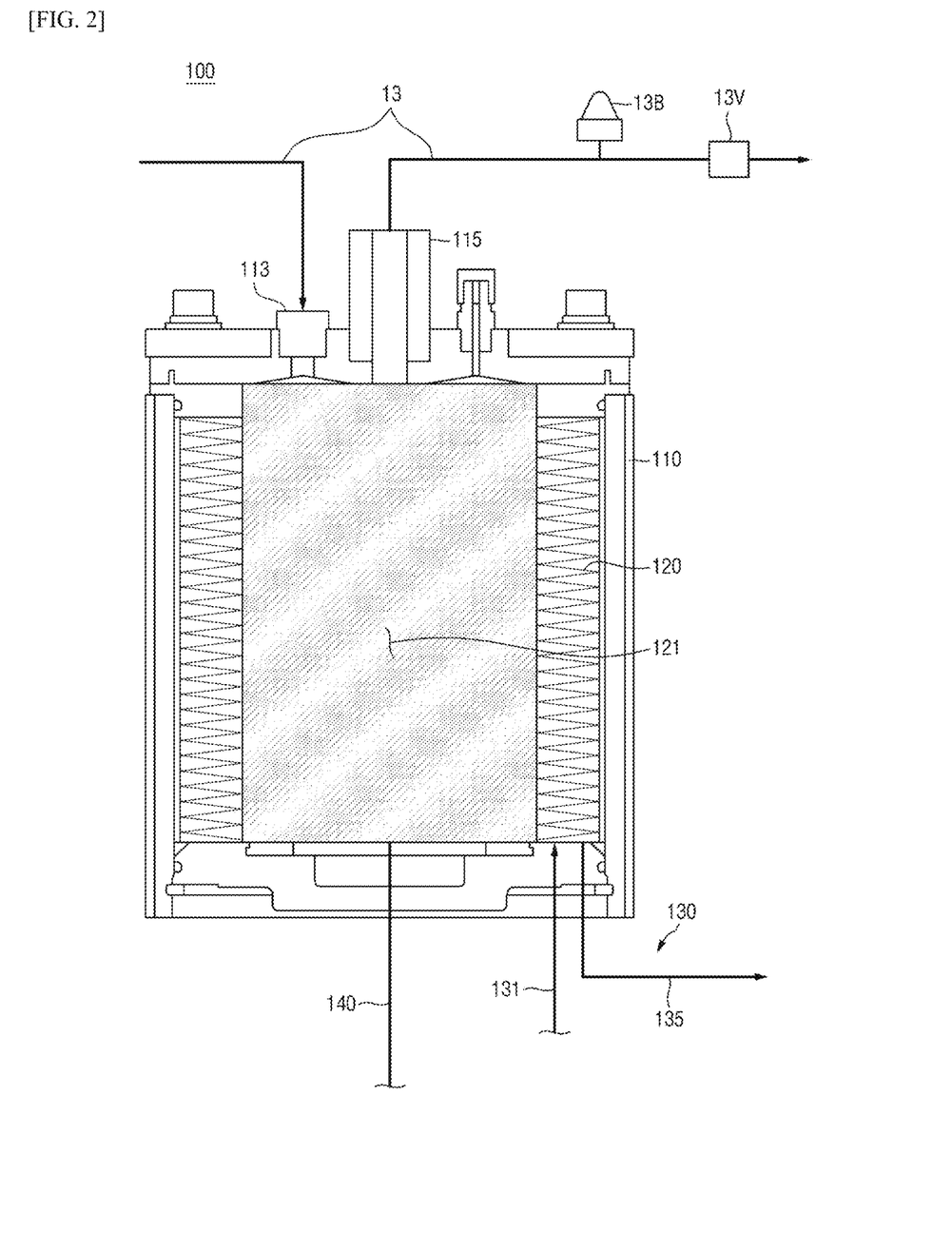
FIG. 2 is a schematic diagram of a liquid supply apparatus according to a first embodiment of the present disclosure.

FIG. 2 is a schematic diagram of a liquid supply apparatus according to a first embodiment of the present disclosure.

Referring to FIG. 2, a liquid supply apparatus 100 may pump a treatment liquid, which flows along a treatment liquid supply line 13, such that the treatment liquid may be supplied in a direction toward a nozzle unit 14.

The liquid supply device 100 may be driven by the supply of an operating fluid. In other words, the liquid supply device 100 may be driven by the supply and discharge of an operating fluid such as an inert gas (e.g., nitrogen) or air, rather than being driven by a cylinder or motor.

For example, a typical pump is driven by a motor, and even if the treatment liquid does not process a substrate, the treatment liquid is continuously discharged. In other words, once the motor starts, a load is generated, and the motor cannot stop and restart. If the motor continues to operate without stopping, the treatment liquid may flow in the direction from the storage tank 13T to the nozzle unit 14 even when the treatment liquid is not processing a substrate. To address this, a circulation structure may be implemented to recover the treatment liquid is recovered from the nozzle unit 14 to the storage tank 13T, or alternatively, the treatment liquid may be discarded, resulting in wastage of the treatment liquid.

On the contrary, the liquid supply apparatus 100, driven by the operating fluid, may not supply the treatment liquid continuously. Hence, there may not be a requirement to circulate the treatment liquid, such as cleaning liquid, simplifying the structure of the liquid supply apparatus 100. There is a possibility of bubble formation during the flow of the treatment liquid along a circulation line. However, by eliminating the circulation line, the risk of bubble generation can be reduced.

Specifically, the liquid supply apparatus 100 may include a base unit 110, bellows 120, an operating unit 130, and a drain line 140.

The base unit 110 may form the appearance of the liquid supply apparatus 100, and an operating space 111, an inlet port 113, and an outlet port 115 may be formed in the base unit 110.

The operating space 111 may be hollow, the bellows 120 may be provided in the operating space 111, and the operating fluid may be allowed to flow in and out of the bellows 120 for the operation of the bellows 120.

The inlet port 113 may receive the treatment liquid. For example, the inlet port 113 may penetrate an upper part of the base unit 110 and communicate with the interior of the bellows 120. In other words, the inlet port 113 may be connected to the treatment liquid supply line 13 and communicate with the bellows 120, allowing the treatment liquid to flow through the treatment liquid supply line 13 to a storage space 121 of the bellows 120. A lower part of the inlet port 113 may form the inlet of the bellows 120.

The outlet port 115 may discharge the treatment liquid. For example, the outlet port 115 may be adjacent to the inlet port 113 and penetrate the upper part of the base unit 110 to communicate with the interior of the bellows 120. In other words, the outlet port 115 may be connected to the treatment liquid supply line 13 and communicate with the bellows 120, allowing the treatment liquid to flow from the storage space 121 to the treatment liquid supply line 13 on a side of the nozzle unit 14. The lower part of the outlet port 115 may form the outlet of the bellows 120.

The bellows 120 may expand or contract to adjust the volume of the storage space 121 and may supply the treatment liquid to the nozzle unit 14. The inlet, the outlet, and the storage space 121 may be formed in the bellows 120 to allow the treatment liquid to flow in and out of the bellows 120.

The inlet port 113 may extend to the inlet of the bellows 120, allowing the treatment liquid to enter the storage space 121 through the inlet of the bellows 120. The inlet of the bellows 120 may be positioned adjacent to the outlet of the bellows 120, at the top of the bellows 120.

The outlet portion 115 may extend to the outlet of the bellows 120 and may allow the treatment liquid to be discharged. The outlet of the bellows 120 may be provided at the top of the bellows 120 to ensure that air is discharged along with the treatment liquid without being accumulated in the storage space 121.

The storage space 121 may communicate with the inlet and the outlet of the bellows 120 such that the treatment liquid may flow in and out of the storage space 121. The storage space 121 may be separated from the operating space 111. For example, the bellows 120 may be provided inside the base unit 110, and the operating space 111 may be formed on the outside of the bellows 120 such that the bellows 120 may expand or contract depending on the discharge and supply of the operating fluid. In other words, the bellows 120 may be provided inside the base unit 110 to be able to expand or contract in accordance with a variation in the inner pressure of the operating space 111.

The operating unit 130 may supply the operating fluid into or discharge the operating fluid out of the operating space 111.

The operating unit 130 may supply the operating fluid into the operating space 111 to allow the bellows 120 to contract. The operating unit 130 may discharge the operating fluid from the operating space 111 to allow the bellows 120 to expand. The treatment liquid may be discharged from the storage space 121 and supplied to the nozzle unit 14 through the supply and discharge of the operating fluid by the operating unit 130.

For example, the actuator 130 may include an operating fluid supply line 131 and an operating fluid discharge line 135. The operating fluid supply line 131 and the operating fluid discharge line 135 may be installed to penetrate the base unit 110, from below the operating space 111, to establish communication with the operating space 111, but the present disclosure is not limited thereto.

The operating fluid supply line 131 may supply the operating fluid into the operating space 111 to allow the bellows 120 to contract. In other words, the operating fluid supply line 131 can increase the internal pressure of the operating space 111 to pressurize the bellows 120 in an upward direction. For example, the operating fluid supply line 131 may be equipped with a nitrogen supply device or a compressor that supplies compressed air, but the present disclosure is not limited thereto.

The operating fluid discharge line 135 may discharge the operating fluid to allow the bellows 120 to expand. In other words, the operating fluid discharge line 135 can lower the internal pressure of the operating space 111, causing the bottom surface of the bellows 120 to be pulled in a downward direction. For example, the operating fluid discharge line 135 may be equipped with a valve for venting or an ejector.

The drain line 140 communicates with the storage space 121 from below the base unit 110 and may discharge the treatment liquid. Although not specifically illustrated, the drain line 140 may be equipped with a valve for flow control.

The drain line 140 may discharge the residual treatment liquid in the storage space 121 to facilitate the replacement of the treatment liquid. For example, the drain line 140 may discharge the residual treatment liquid with the bellows 120 in its minimally contracted state, minimizing or preventing the mixing of a newly supplied treatment liquid with the existing treatment liquid.

The supply of the treatment liquid and the discharge of the residual treatment liquid will hereinafter be described.

Figure 3:
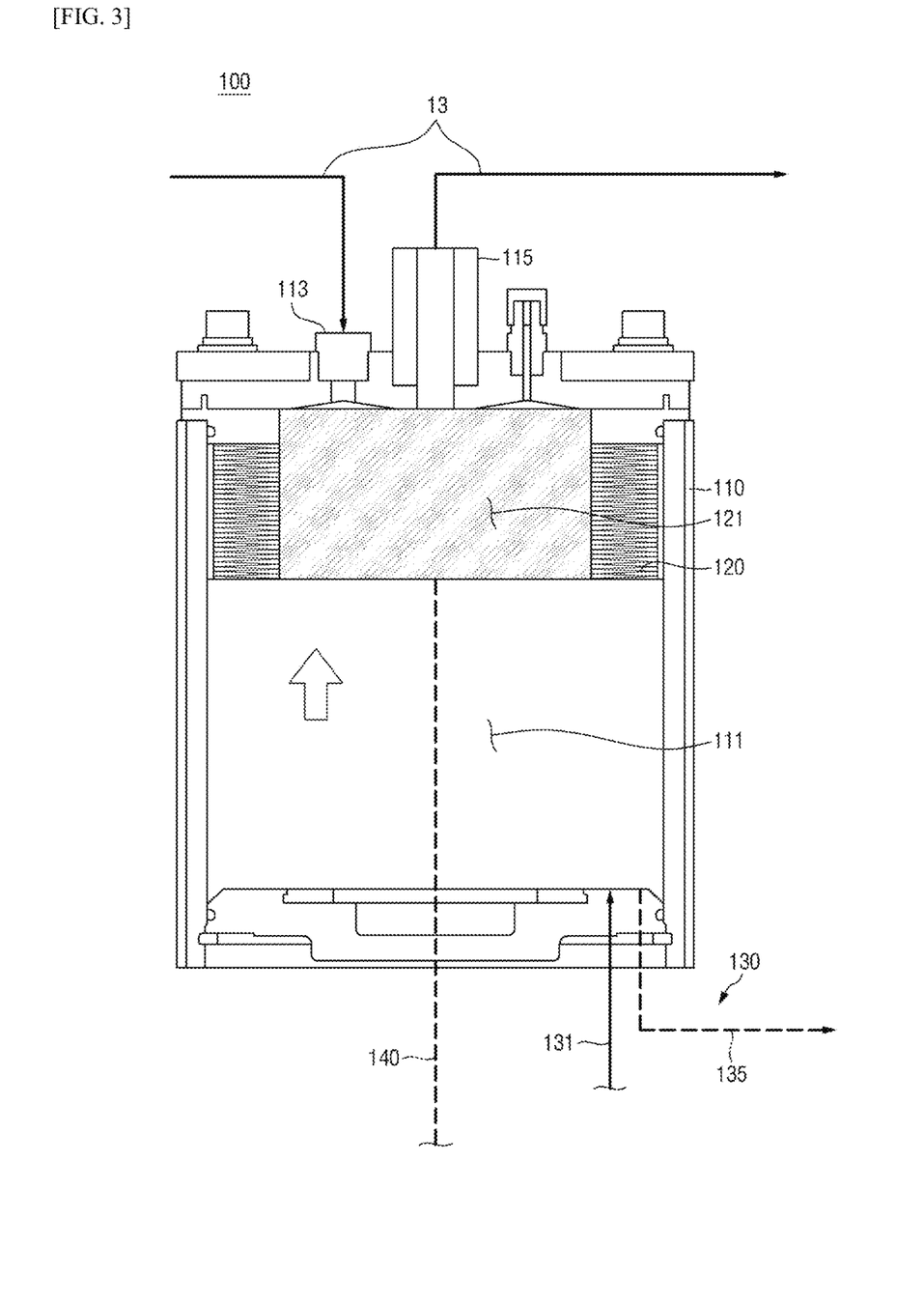
FIG. 3 is a schematic diagram illustrating the contracted state of bellows in the liquid supply apparatus according to the first embodiment of the present disclosure.
Figure 4:
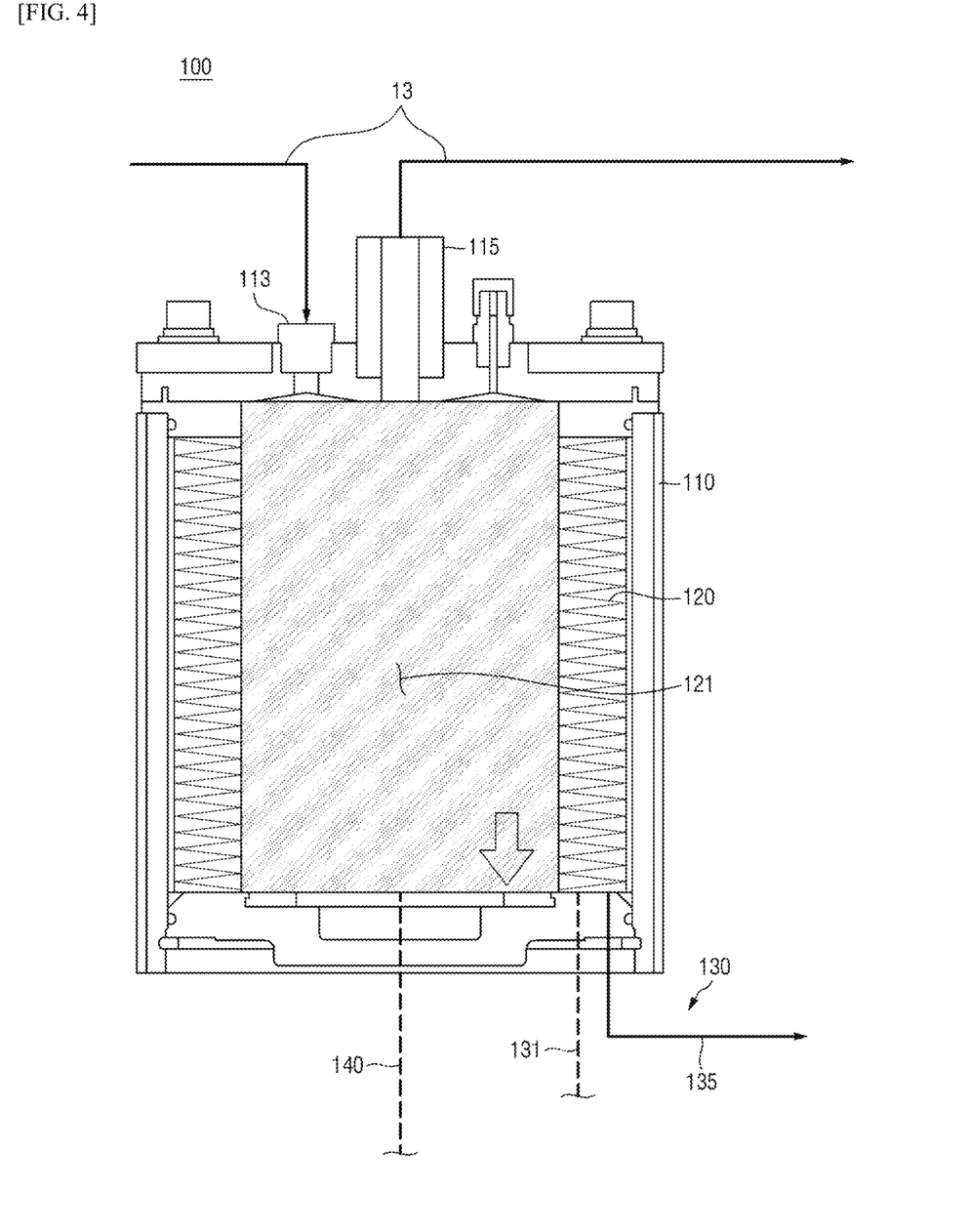
FIG. 4 is a schematic diagram illustrating the expanded state of the bellows in the liquid supply apparatus according to the first embodiment of the present disclosure.
Figure 5:
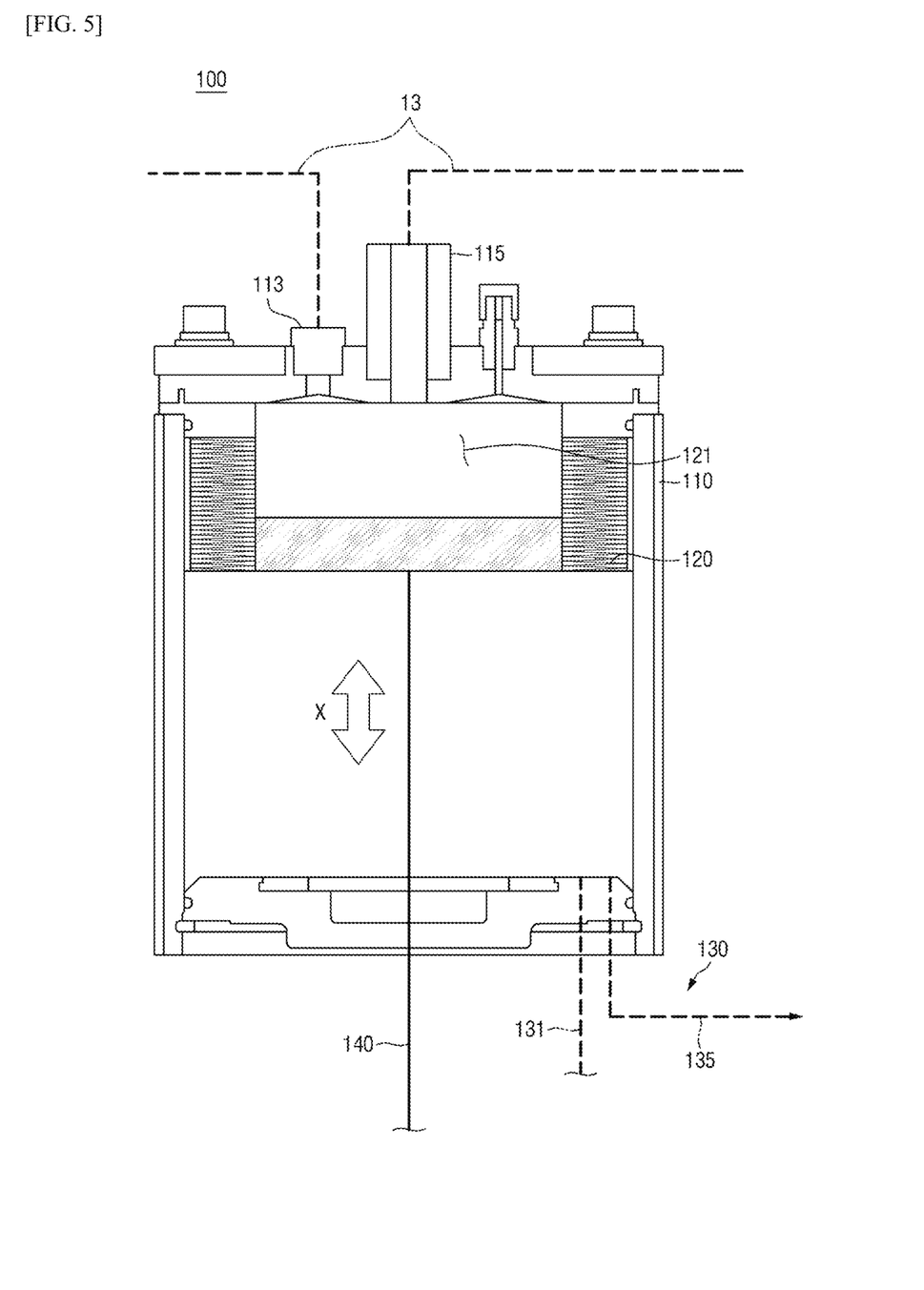
FIG. 5 is a schematic diagram illustrating a state in which the supply of a treatment liquid is stopped and the remaining treatment liquid is being discharged from the liquid supply device according to the first embodiment of the present disclosure.

FIGS. 3 through 5 are diagrams illustrating the operations of the bellows and the drain line of the liquid supply apparatus of FIG. 2.

Referring to FIGS. 3 and 4, the liquid supply device 100 allows the bellows 120 to expand or contract, thereby changing the volume of the storage space 121, and as a result, the treatment liquid may be supplied to the nozzle unit 14.

As illustrated in FIG. 3, the operating fluid supply line 131 may supply the operating fluid into the operating space 111, causing the bellows 120 to contract. The contraction of the bellows 120 leads to an increase in the internal pressure within the operating space 111, pressurizing the bottom surface of the bellows 120 upward. As a result, the volume of the storage space 121 within the bellows 120 may decrease. Consequently, the treatment liquid within the storage space 121 may be supplied to the nozzle unit 14 through the outlet port 115.

As illustrated in FIG. 4, the bellows 120 may expand, allowing the storage space 121 to be filled with the treatment liquid. For this purpose, the operating fluid may be discharged from the operating space 111 through the operating fluid discharge line 135. The expansion of the bellows 120 leads to an increase in the volume of the storage space 121. With the expansion of the storage space 121, the treatment liquid may be introduced into the storage space 121 through the inlet port 113.

Thus, the treatment liquid can be supplied to the nozzle unit 14 through the expansion and contraction of the bellows 120 driven by the operating unit 130.

Furthermore, when the treatment liquid is provided as a cleaning solution (or a developing solution), the treatment liquid may not be continuously ejected, but the flow of the treatment liquid may be stopped. For example, during standby at the recessed port, the treatment liquid can be prevented from being continuously discharged, thereby avoiding wastage of the treatment liquid.

In other words, the supply of the treatment liquid to the nozzle unit 14 may be halted. For this purpose, the flow of the operating fluid may be stopped. For example, the operating fluid supply line 131 and the operating fluid discharge line 135 may both be closed to maintain a constant internal pressure in the operating space 111.

The liquid supply device 100 allows for the replacement of the treatment liquid. Since the properties or viscosity of the treatment liquid may vary, it is desirable to supply a new treatment liquid after emptying the remaining treatment liquid.

Referring to FIG. 5, the remaining treatment liquid in the storage space 121 may be discharged before supplying a new treatment liquid.

For this purpose, in a state where the expansion or contraction of the bellows 120 is halted, in other words, in a state where the internal pressure of the operating space 111 remains unchanged, the flow path of the drain line 140 may be opened to allow the remaining treatment liquid to be discharged.

The state where the internal pressure of the operating space 111 remains unchanged corresponds to the condition where the treatment liquid is not supplied and the discharge of the treatment liquid to the nozzle unit 14 is stopped. To this end, the flow paths of both the operating fluid supply line 131 and the operating fluid discharge line 135 may be closed, thereby halting the flow of the operating fluid.

In this manner, the drain line 140 can discharge the remaining treatment liquid in the storage space 121 with the expansion or contraction of the bellows 120 halted. The drain line 140, which communicates with the storage space 121 at the bottom of the bellows 120, can discharge the treatment liquid, including the liquid on the inner bottom surface of the storage space 121, minimizing the amount of remaining treatment liquid.

During the replacement of the treatment liquid, the storage space 121 of the bellows 120 may be rinsed, and this will hereinafter be described with reference to FIGS. 6 through 10.

Figure 6:
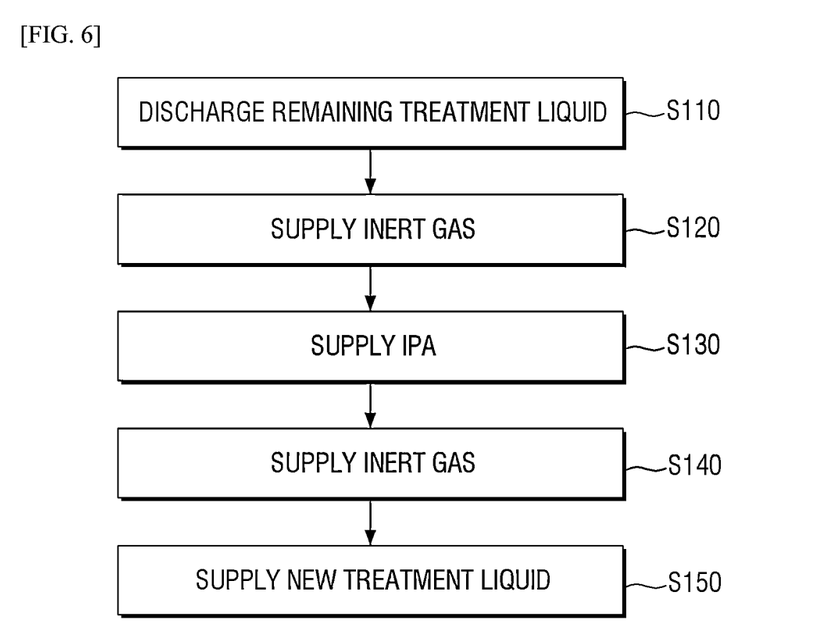
FIG. 6 is a flowchart illustrating a cleaning process of the liquid supply device according to the first embodiment of the present disclosure.

FIG. 6 is a flowchart illustrating a cleaning operation for the liquid supply apparatus of FIG. 2. FIGS. 7 through 10 are diagrams illustrating how to rinse the liquid supply apparatus of FIG. 2 and supply a new treatment liquid.

Referring to FIGS. 6 through 10, the following processes may be performed to replace the existing treatment liquid within the storage space 121 with a new treatment liquid.

The storage space 121 may be supplied with an inert gas and a clean fluid, such as a cleaning fluid, through the inlet port 113. The clean fluid may be discharged through the drain line 140, instead of the outlet port 115, which is intended for supplying the treatment liquid to the nozzle unit 14. However, the present disclosure is not limited to this. Alternatively, the clean liquid may be discharged through the outlet port 115, and the treatment liquid supply line 13, located downstream of the outlet port 115, may be rinsed.

Figure 7:
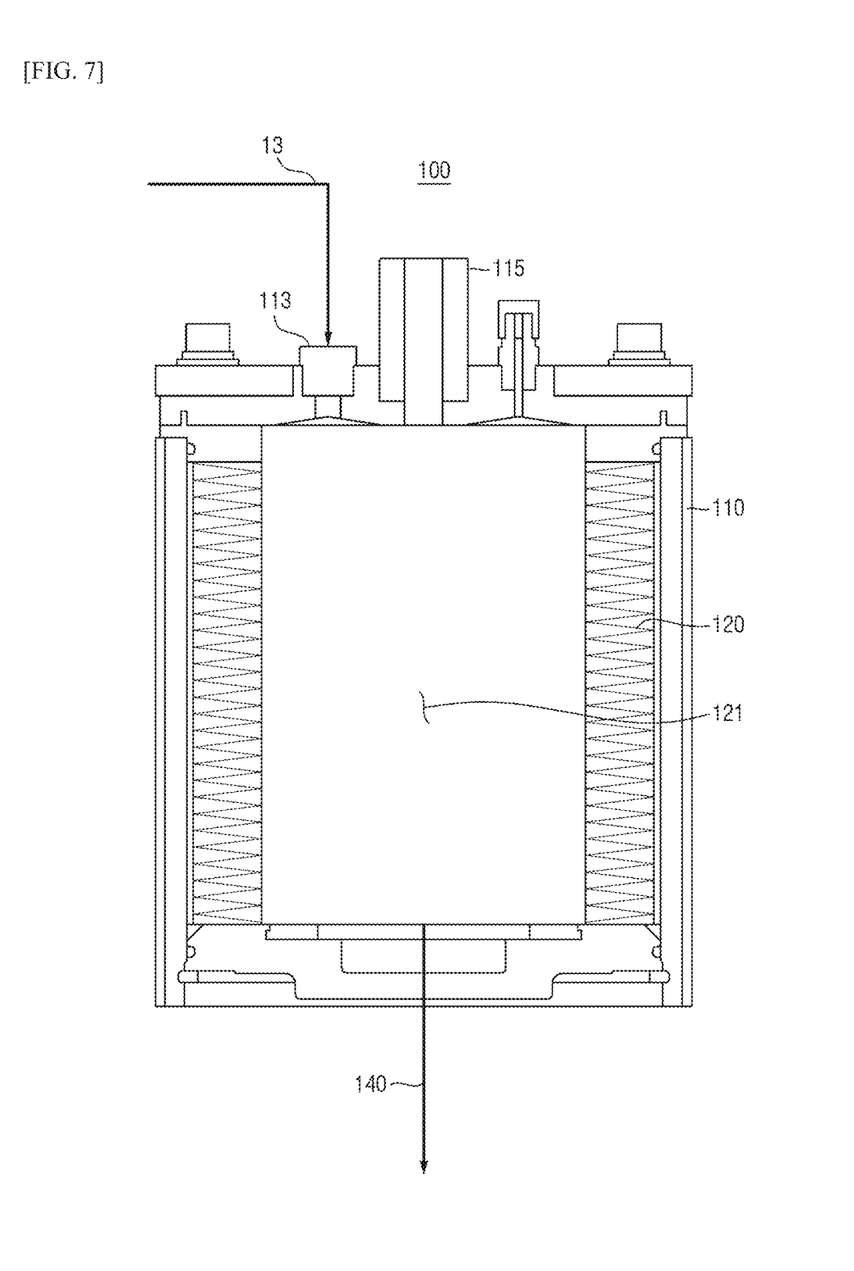
FIG. 7 is a schematic diagram illustrating a state in which the remaining treatment liquid is discharged from the liquid supply device according to the first embodiment of the present disclosure.

Referring to FIGS. 6 and 7, as already mentioned with reference to FIG. 5, the flow path of the drain line 140 may be opened to discharge the remaining treatment liquid on the inner bottom surface of the storage space 121 (S110).

To minimize the waste of the treatment liquid, the remaining treatment liquid may be discharged when the bellows 120 is in its minimally contracted state. However, the present disclosure is not limited to this, and various modifications are possible. Alternatively, the remaining treatment liquid may be discharged when the bellows 120 is maximally expanded. Furthermore, the bellows 120 may be maximally expanded after discharging the remaining treatment liquid in its minimally contracted state.

Figure 8:
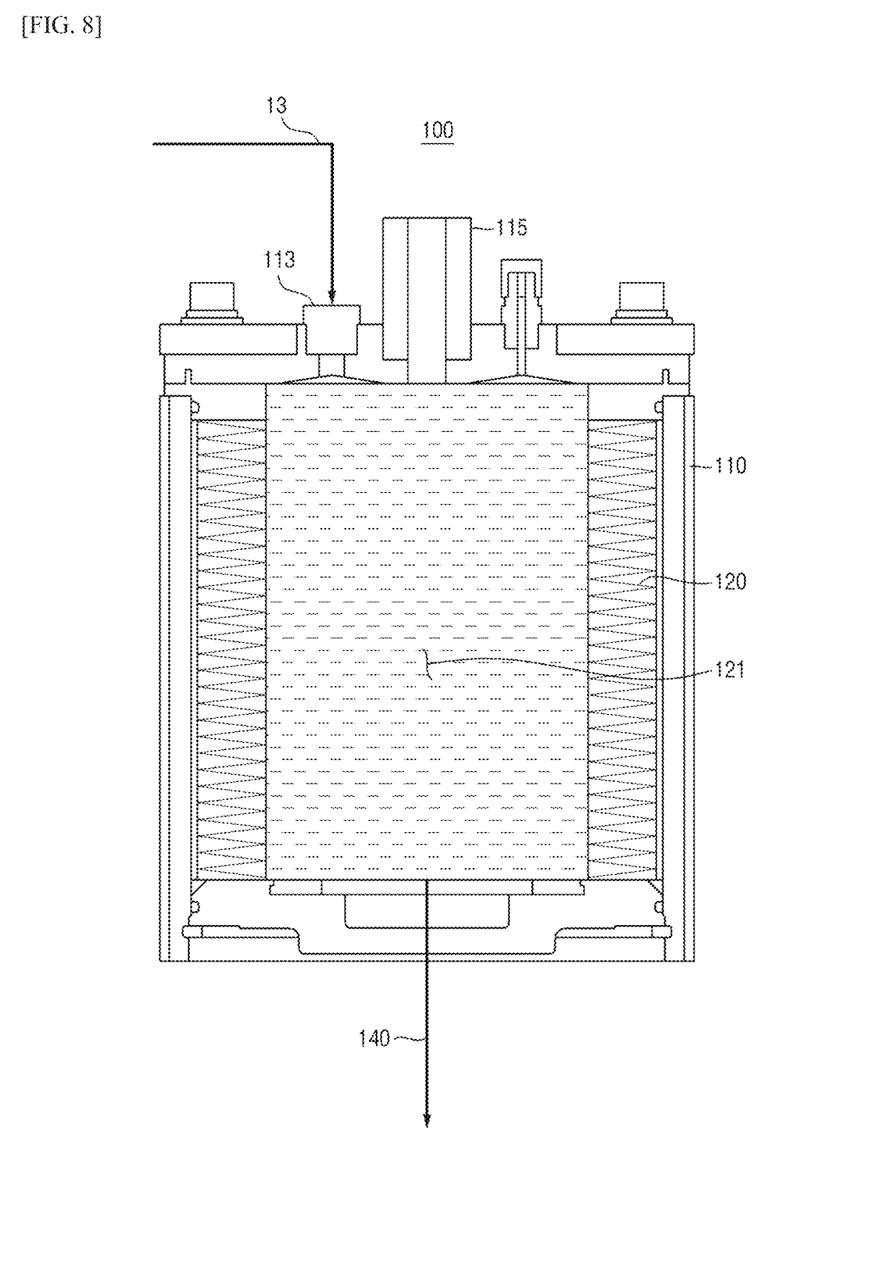
FIG. 8 is a schematic diagram illustrating a state in which an inert gas is supplied inside the storage space of the liquid supply device according to the first embodiment of the present disclosure.

Thereafter, referring to FIGS. 6 and 8, to minimize the use of a cleaning fluid, an inert gas may be supplied to the storage space 121 before supplying the cleaning fluid (S120). For example, nitrogen may be supplied through the inlet port 113 and may be released through the drain line 140 to purge the storage space 121.

Figure 9:
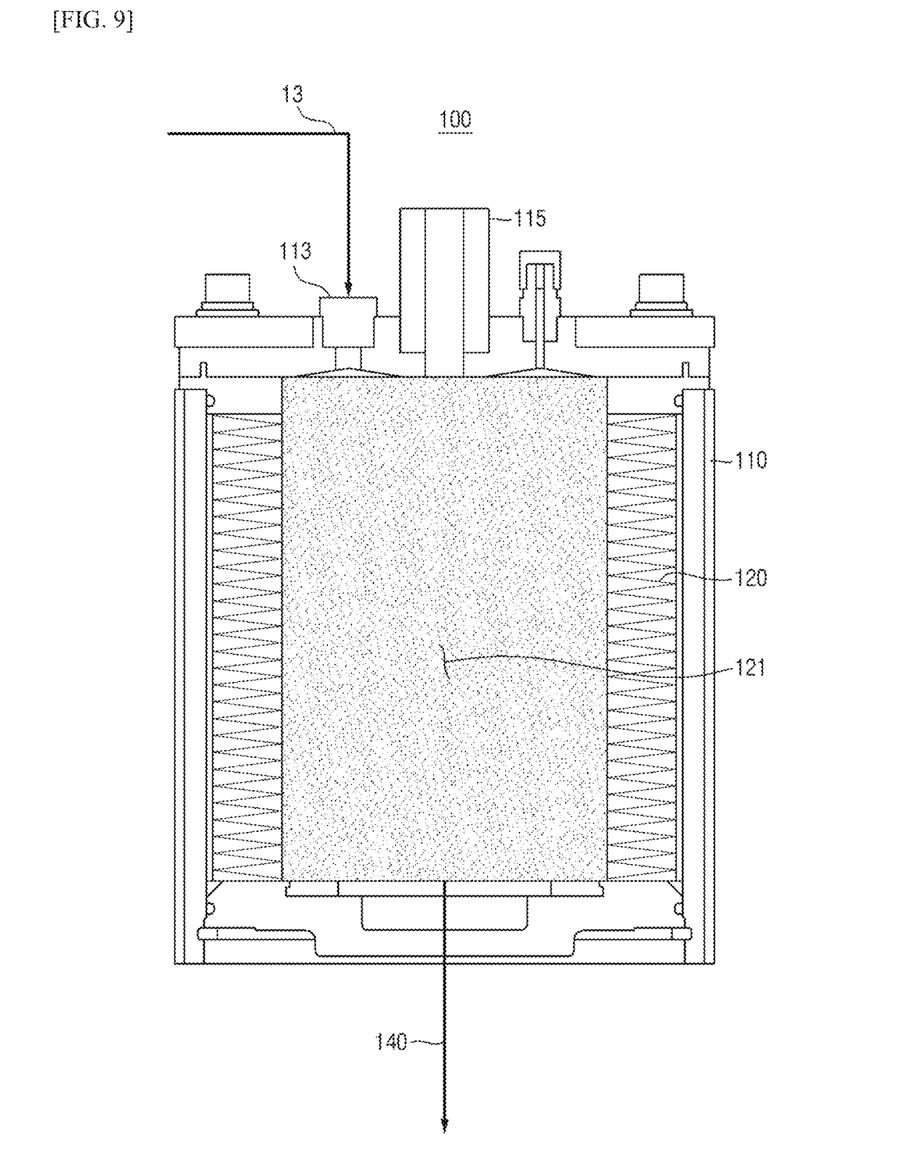
FIG. 9 is a schematic diagram illustrating a state in which a cleaning fluid is supplied inside the storage space of the liquid supply device according to the first embodiment of the present disclosure.

Thereafter, referring to FIGS. 6 and 9, the storage space 121 may be rinsed by supplying a cleaning fluid into the storage space 121 (S130). The cleaning fluid may be isopropyl alcohol (IPA). The cleaning fluid may differ from a cleaning solution for the treatment liquid, and the cleaning solution may be a thinner. However, the present disclosure is not limited to this.

For a cleaning operation using the cleaning fluid, the cleaning fluid may be supplied through the inlet port 113 and discharged through the drain line 140 to clean the storage space 121.

Thereafter, referring to FIG. 6, to ensure that no cleaning fluid remains in the storage space 121, the storage space 121 may be purged again (S140).

Figure 10:
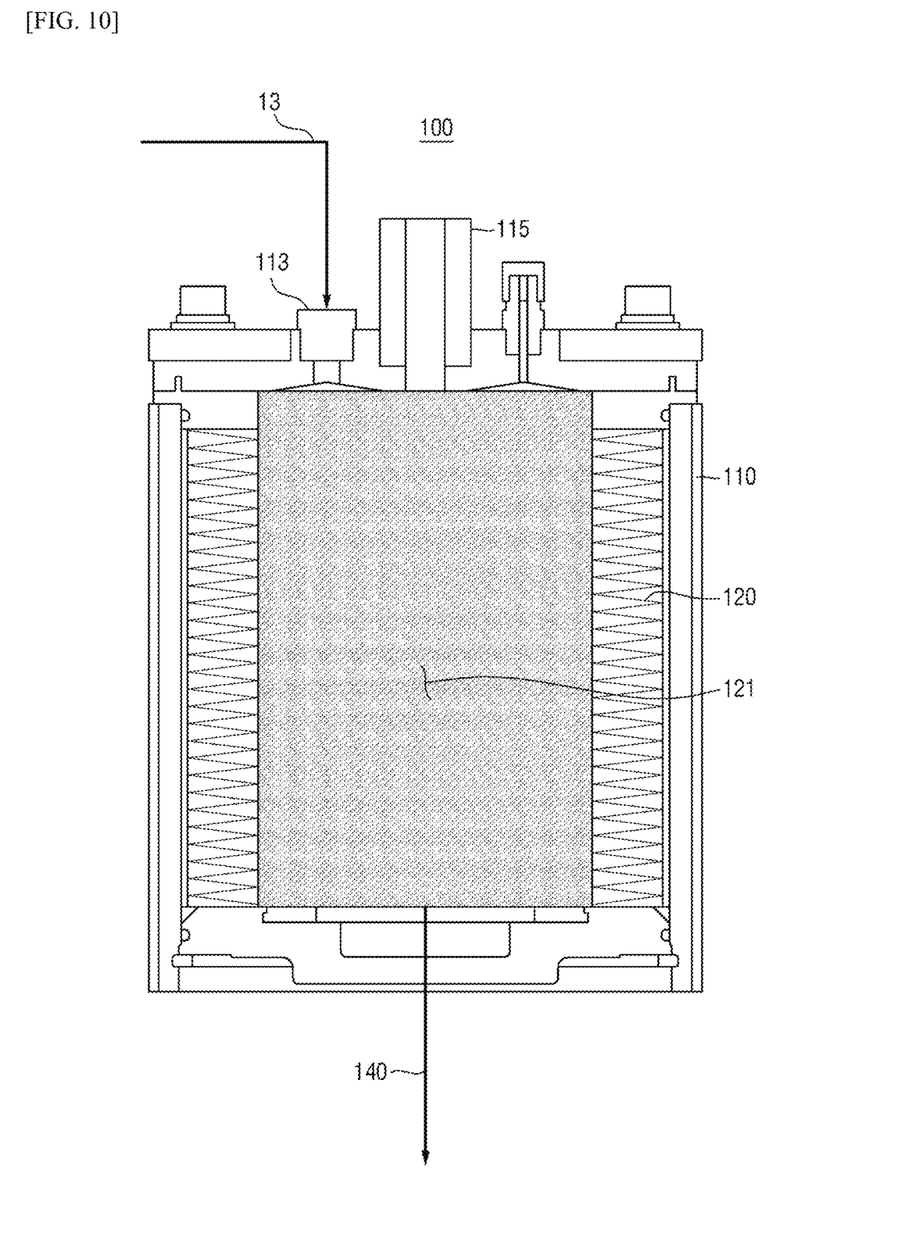
FIG. 10 is a schematic diagram illustrating a state in which a new processing liquid is supplied inside the storage space of the liquid supply device according to the first embodiment of the present disclosure.

Thereafter, referring to FIGS. 6 and 10, a new treatment liquid may be supplied to the storage space 121 (S150). When supplying the new treatment liquid to the storage space 121 through the inlet port 113, the flow path of the drain line 140 may be temporarily opened at an early stage to purge nitrogen from the storage space 121. After all the nitrogen has been purged from the storage space 121, the flow path of the drain line 140 may be closed to allow the new treatment liquid to be supplied to the nozzle unit 14. However, the present disclosure is not limited to this.

A liquid supply apparatus according to another embodiment of the present disclosure will hereinafter be described with reference to FIGS. 11 and 12, and redundant descriptions of duplicate configurations with the same functions are omitted.

Figure 11:
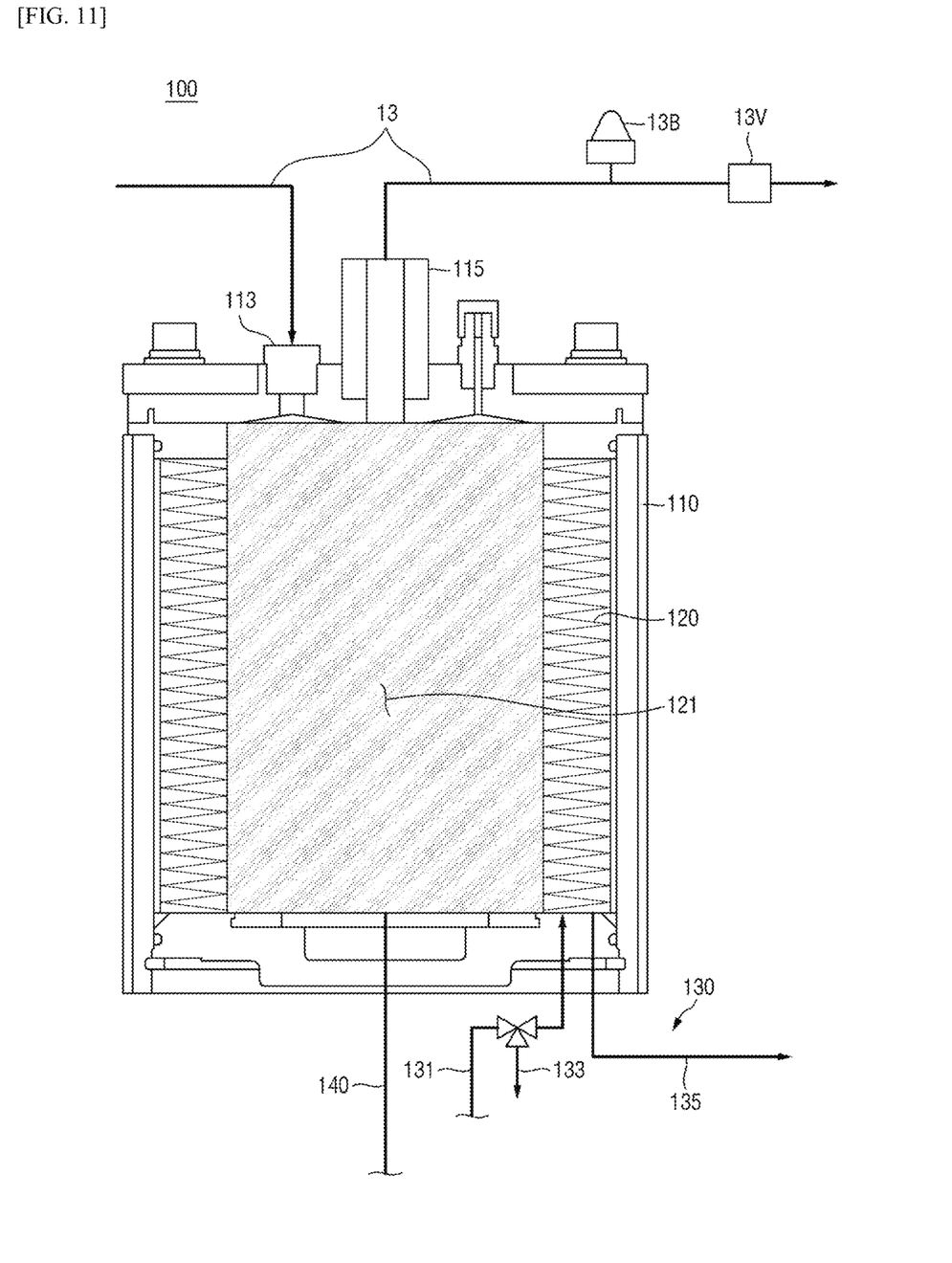
FIG. 11 is a schematic diagram of a liquid supply device according to a second embodiment of the present disclosure.

FIG. 11 is a schematic diagram of a liquid supply apparatus according to a second embodiment of the present disclosure. FIG. 12 is a schematic diagram illustrating the bypass of an operating fluid in the liquid supply apparatus of FIG. 11. The embodiment of FIGS. 11 and 12 will hereinafter be described, highlighting the differences with the embodiments of FIGS. 2 through 10.

Figure 12:
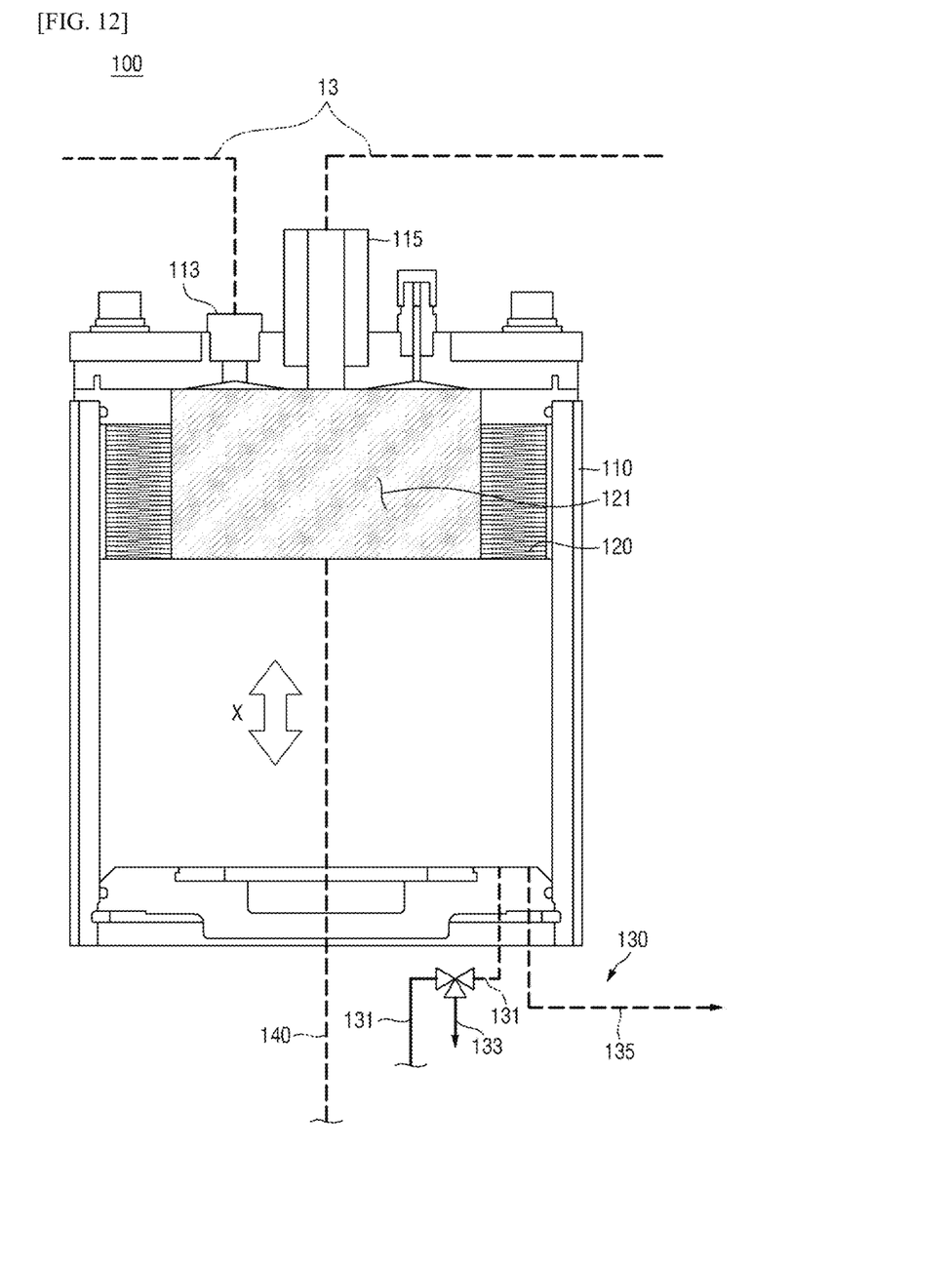
FIG. 12 is a schematic diagram illustrating a state in which an operating fluid is bypassed in the liquid supply device according to the second embodiment of the present disclosure.

Referring to FIGS. 11 and 12, a liquid supply apparatus 100, like its counterpart of FIGS. 2 through 10, may include a base unit 110, bellows 120, an operating unit 130, and a drain line 140.

In the embodiment of FIGS. 11 and 12, unlike in the embodiment of FIGS. 2 through 10, the operating unit 130 further includes a bypass line 133. That is, the operating unit 130 may include an operating fluid supply line 131, the bypass line 133, and an operating fluid discharge line 135.

The bypass line 133 may diverge from the operating fluid supply line 131 and may enable a treatment liquid to bypass. Thus, an operating fluid can be redirected through the bypass line 133 and can thus pass through the operating fluid supply line 131 without increasing the internal pressure within an operating space 111, as the operating fluid. The purpose of bypassing the operating fluid via the bypass line 133 is to prevent the contraction of the bellows 120.

Referring to FIG. 12, even when the operating fluid passes through the operating fluid supply line 131, the bypass line 133 may be opened to prevent the treatment liquid from being ejected from a nozzle unit 13 in a recessed port, and as a result, the operating fluid may be discharged through the bypass line 133.

Consequently, the operating fluid is not supplied to the operating space 111 so that the contraction of the bellows 120 may be prevented. Furthermore, the flow path of the operating fluid discharge line 135 may be closed. Therefore, the expansion of the bellows 120 can also be prevented because the internal pressure within the operating space 111 does not change.

In the first embodiment, the operating unit 130 closes both the flow paths of the operating fluid supply line 131 and the operating fluid discharge line 135 to prevent any change in the volume of a storage space 121. On the contrary, in the second embodiment, the operating unit 130 allows the operating fluid to flow through the operating fluid supply line 133, but bypass the storage space 121 through the bypass line 133 without entering the storage space 121. In other words, various modifications are possible to achieve a state where the internal pressure within the operating space 111 remains unchanged.

Additionally, although not specifically illustrated, the bypass line 133 may rejoin the operating fluid supply line 131 for circulation. Since the operating fluid, unlike the treatment liquid, does not require consideration for bubble reformation issues, the circulation line of the operating fluid does not need a configuration to prevent bubble reformation or remove bubbles, simplifying the structure of the liquid supply apparatus 100.

Embodiments of the present disclosure have been described with reference to the accompanying drawings. However, it should be understood that the present disclosure is not limited to these embodiments and can be implemented in various other forms. Those skilled in the art to which the present disclosure pertains, with ordinary knowledge in the field, will understand that the technical concepts or essential features of the present disclosure can be implemented in different specific forms without altering their essence. Therefore, the embodiments described above should be considered exemplary and not restrictive in any way.

What is claimed is:

1. A liquid supply apparatus comprising:
   a base unit having an operating space, an inlet port, through which a treatment liquid is introduced, and an outlet port, through which the treatment liquid is discharged, formed therein;
   bellows having the operating space formed on its outside within the base unit, including an inlet and an outlet, which form ends of the inlet and outlet ports, respectively, of the base unit and communicate to create a storage space that the treatment liquid flows in and out of, and expanding or contracting to increase or reduce the volume of the storage space;
   an operating unit supplying an operating fluid into or discharging the operating fluid from the operating space; and
   a drain line communicating with the storage space, from below the base unit, and discharging the treatment liquid,
   wherein
   the operating unit supplies the operating fluid into the operating space to enable the bellows to contract, or discharges the operating fluid from the operating space to enable the bellows to expand, and
   the drain line discharges residual treatment liquid remaining in the storage space to replace the treatment liquid.

2. The liquid supply apparatus of claim 1, wherein the outlet of the bellows is provided at a top of the bellows to discharge air along with the treatment liquid without being accumulated in the storage space.

3. The liquid supply apparatus of claim 2, wherein the inlet of the bellows is provided at the top of the bellows, adjacent to the outlet of the bellows.

4. The liquid supply apparatus of claim 1, wherein the operating unit includes an operating fluid supply line, which supplies the operating fluid to allow the bellows to expand, and an operating fluid discharge line, which discharges the operating fluid to allow the bellows to contract.

5. The liquid supply apparatus of claim 4, wherein the operating unit further includes a bypass line, which diverges from the operating fluid supply line and bypasses the treatment liquid.

6. The liquid supply apparatus of claim 1, wherein the operating fluid includes an inert gas or air.

7. The liquid supply apparatus of claim 1, wherein the treatment liquid includes a cleaning fluid or a developing solution.

8. The liquid supply apparatus of claim 1, wherein the drain line discharges the treatment liquid from the storage space with the bellows in its minimally contracted state.

9. A substrate treatment apparatus comprising:
a substrate support unit supporting a substrate;
a cup portion surrounding the substrate support unit;
a nozzle unit connected to a treatment liquid supply line and ejecting a treatment liquid onto the substrate; and
a liquid supply apparatus provided in the treatment liquid supply line and suppling the treatment liquid to the nozzle unit,
wherein
the liquid supply apparatus includes a base unit having an operating space, an inlet port, through which the treatment liquid is introduced, and an outlet port, through which the treatment liquid is discharged, formed therein, bellows having the operating space formed on its outside within the base unit, including an inlet and an outlet, which form ends of the inlet and outlet ports, respectively, of the base unit and communicate to create a storage space that the treatment liquid flows in and out of, and expanding or contracting to increase or reduce the volume of the storage space, an operating unit supplying an operating fluid into or discharging the operating fluid from the operating space, and a drain line communicating with the storage space, from below the base unit, and discharging the treatment liquid,
the operating unit supplies the operating fluid into the operating space to enable the bellows to contract, or discharges the operating fluid from the operating space to enable the bellows to expand, and
the drain line discharges residual treatment liquid remaining in the storage space to replace the treatment liquid.

10. The substrate treatment apparatus of claim 9, wherein the outlet of the bellows is provided at a top of the bellows.

11. The substrate treatment apparatus of claim 10, further comprising:
a bubble cutter provided downstream of the liquid supply apparatus and removing bubbles.

12. The substrate treatment apparatus of claim 10, further comprising:
an air vent provided downstream of the liquid supply apparatus, in the treatment liquid supply line, and discharging dissolved gases.

13. The substrate treatment apparatus of claim 10, wherein the inlet of the bellows is provided at the top of the bellows, adjacent to the outlet of the bellows.

14. The substrate treatment apparatus of claim 9, wherein the operating unit includes an operating fluid supply line, which supplies the operating fluid to allow the bellows to expand, and an operating fluid discharge line, which discharges the operating fluid to allow the bellows to contract.

15. The substrate treatment apparatus of claim 14, wherein the operating unit further includes a bypass line, which diverges from the operating fluid supply line and bypasses the treatment liquid.

16. The substrate treatment apparatus of claim 9, wherein the operating fluid includes an inert gas or air.

17. The substrate treatment apparatus of claim 9, wherein the treatment liquid includes a cleaning fluid or a developing solution.

18. The substrate treatment apparatus of claim 9, wherein the drain line discharges the treatment liquid from the storage space with the bellows in its minimally contracted state.

19. A liquid supply apparatus having a treatment liquid supply line connected thereto and supplying the treatment liquid to a nozzle unit, which ejects the treatment liquid onto a substrate, the liquid supply apparatus comprising:
a base unit having an operating space, an inlet port, which is formed through an upper part of the base unit and through which treatment liquid is introduced, and an outlet port, which is formed through the upper part of the base unit adjacent to the inlet port and through which the treatment liquid is discharged, formed therein;
bellows having the operating space formed on its outside within the base unit, including an inlet and an outlet, which form ends of the inlet and outlet ports, respectively, of the base unit and communicate to create a storage space that the treatment liquid flows in and out of, and expanding or contracting to increase or reduce the volume of the storage space;
an operating unit supplying an operating fluid, which includes an inert gas or air, into or discharging the operating fluid from the operating space; and
a drain line communicating with the storage space, from below the base unit, and discharging the treatment liquid,
wherein
the operating unit supplies the operating fluid into the operating space to enable the bellows to contract, or discharges the operating fluid from the operating space to enable the bellows to expand, and
the drain line discharges residual treatment liquid remaining in the storage space in a state where the contraction and expansion of the bellows have stopped with the bellows in its minimally contracted state.

* * * * *